United States Patent [19]

Sinta et al.

[11] Patent Number: 5,344,742
[45] Date of Patent: Sep. 6, 1994

[54] BENZYL-SUBSTITUTED PHOTOACTIVE COMPOUNDS AND PHOTORESIST COMPOSITIONS COMPRISING SAME

[75] Inventors: Roger F. Sinta, Woburn; George Barclay, Allston; Martha M. Rajaratnam, Dedham, all of Mass.

[73] Assignee: Shipley Company Inc., Marlborough, Mass.

[21] Appl. No.: 50,920

[22] Filed: Apr. 21, 1993

[51] Int. Cl.$^5$ ............... G03C 1/492; G03C 1/494; G03C 1/76
[52] U.S. Cl. ............... 430/270; 430/325; 430/326; 430/921; 430/286; 430/287; 430/281
[58] Field of Search ............... 430/270, 325, 326, 921, 430/286, 287

[56] References Cited

U.S. PATENT DOCUMENTS 5,118,582 6/1992 Ueno et al. .
5,204,217 4/1993 Aoai et al. .

FOREIGN PATENT DOCUMENTS 0515079 11/1992 European Pat. Off. ............ 430/270
4121748 4/1992 Japan .
4287041 10/1992 Japan ................................ 430/921

Primary Examiner—Marion E. McCamish
Assistant Examiner—Bernard Codd
Attorney, Agent, or Firm—Robert L. Goldberg; Peter F. Corless

[57] ABSTRACT

The present invention comprises certain benzyl-substituted photoactive compounds and photoresist compositions comprising such photoactive compounds. The benzyl-substituted photoactive compounds of the invention are particularly suitable as the photoactive component in chemically amplified positive-acting and negative-acting compositions.

28 Claims, No Drawings

BENZYL-SUBSTITUTED PHOTOACTIVE COMPOUNDS AND PHOTORESIST COMPOSITIONS COMPRISING SAME

BACKGROUND OF THE INVENTION

1. Field of the Invention

The present invention relates to novel benzyl-substituted photoactive compounds and photoresist compositions comprising such compounds.

2. Background Art

Photoresists are photosensitive films used for transfer of images to a substrate. They can form negative or positive images. After a coating layer of a photoresist is formed on a substrate, the coating is selectively exposed through a photomask to a source of activating energy such as ultraviolet light. The photomask has areas that are opaque to activating radiation and other areas that are transparent to activating radiation. The pattern in the photomask of opaque and transparent areas defines a desired image to be transferred to a substrate. A relief image is provided upon development of the latent image patterned in the resist coating. The use of photoresists are generally described, for example, in Deforest, *Photoresist Materials and Processes*, McGraw Hill Book Company, New York (1975) and in Moreau, *Semiconductor Lithography, Principles, Practices and Materials*, Plenum Press, New York (1988), both incorporated herein by reference.

Various attempts have been made to alter the make-up of photoresist compositions to improve performance of functional properties. In particular, a variety of photoactive compounds have been reported for use in photoresist compositions.

Relatively recently interest has increased in photoresists that can be photoimaged with deep U.V. radiation. Such photoresists offer the potential of forming images of smaller features than may be possible at longer wavelength exposure. As is recognized by those in the art "deep U.V. radiation" refers to exposure radiation having a wavelength in the range of about 350 nm or less, more typically is the range of about 300 nm or less. While a number of photoactive compounds have been reported for use at deep U.V. exposure wavelengths, the need exists for new compounds suitable for use as a photoactive component in photoresist compositions, particularly new photoactive compounds that can be activated by deep U.V. radiation.

SUMMARY OF THE INVENTION

We have now discovered novel photoactive compounds that exhibit exceptional lithographic functional properties when used in either positive-acting or negative-acting photoresist compositions. Preferred photoactive compounds of the invention can be photoactivated upon exposure to deep U.V. radiation.

More particularly, in one aspect of the invention, compounds of the following formula I are provided:

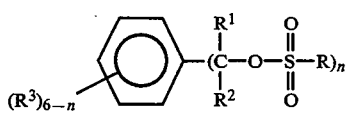

wherein R is selected from the group consisting of substituted and unsubstituted alkoxy, substituted and unsubstituted alkyl, substituted and unsubstituted aralkyl, and substituted and unsubstituted aryl;

$R^1$ and $R^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, and unsubstituted aralkyl and substituted and unsubstituted aryl;

each phenyl ring substituent $R^3$ is independently selected from the group consisting of hydrogen, halo, hydroxy, cyano, alkanoyl, carboxyl, sulfonyl, substituted and unsubstituted alkyl, substituted and unsubstituted alkoxy, substituted and unsubstituted alkenyl, substituted and unsubstituted aryl, and substituted and unsubstituted aralkyl; and n is an integer of from 1 to 6.

Preferred compounds of formula I include those compounds where n is equal to 1, more specifically photoactive compounds of the following structure:

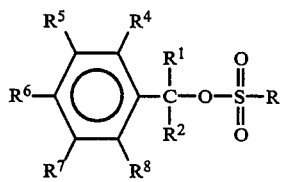

wherein R, $R^1$ and $R^2$ are the same as defined above, and each phenyl ring substituent $R^4$, $R^5$, $R^6$, $R^7$ and $R^8$ is independently selected from the same group as for $R^3$ as specified above.

In other aspect of the invention, compounds of the following formula II are provided:

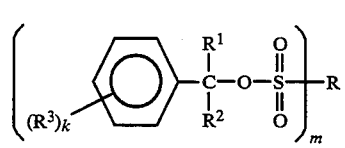

wherein R, $R^1$, $R^2$, $R^3$ are each as defined above for formula I, k is an integer of from 1 to 5 and m is an integer from 2 to 6. Preferably m of formula II is 2 to 4, more preferably 2 to 3, and still more preferably m is 2. Also preferred are those compounds of formula II where R is aryl, including phenyl, particularly where such aryl group is di- or trisubstituted by benzyl sulfonyl groups, i.e. where m is 2 or 3.

Upon exposure to activating radiation, including radiation having a wavelength in the deep U.V. range, compounds of formulas I and II generate an acidic reaction product.

In another aspect, the present invention provides radiation sensitive compositions including photoresists that comprise one or more of the above described photoactive compounds of formula I and/or formula II. Preferred photoresists of the invention include chemically-amplified resists, such as those negative-acting resist compositions which undergo a photoacid-promoted crosslinking reaction to render exposed regions of a coating layer of the resist less developer soluble than unexposed regions, and those positive-acting resist compositions which undergo a photoacid-promoted deprotection reaction of acid labile groups of one or more composition components to render exposed region of a coating layer of the resist more soluble in an aqueous developer than unexposed regions.

The invention also provides methods for forming relief images of the radiation sensitive compositions of the invention, including methods for forming highly resolved patterned photoresist images (e.g., a patterned line having essentially vertical sidewalls) of sub-half micron dimensions. The present invention further provides articles of manufacture comprising substrates such as a microelectronic wafer or a flat panel display substrate having coated thereon the radiation sensitive compositions and relief images of the invention. Other aspects of the invention are disclosed infra.

DETAILED DESCRIPTION OF THE INVENTION

Photoactive compounds of formulas I and II can be prepared by the synthetic route depicted in the Scheme below. Throughout the following discussion the groups R and $R^1$-$R^8$ and the value n are intended to mean the same as defined above. The Scheme depicts a synthesis of a preferred group of photoactive compounds having a single benzylsulfonyl substitution, but as discussed below the synthesis depicted in the Scheme also may be suitably employed to prepare compounds of formula I where n is a value greater than 1 as well as compounds of formula II.

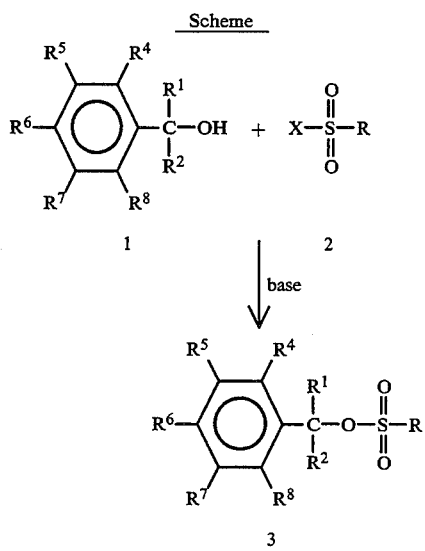

Scheme

In accordance with the Scheme, benzyl alcohol 1 is condensed with sulfonyl compound 2 in the presence of an organic amine or other suitable base to provide compound 3 of formula I. Group X of compound 2 can be any suitable leaving group, e.g. halo such as chloro or bromo. Suitable condensation reaction conditions can be readily determined by the skilled artisan based on the particular constituents used. Many compounds of formulas I and II can be prepared by stirring compounds 1 and 2 in a suitable solvent such as acetone or dimethylformamide at about 0° C. under an inert atmosphere such as nitrogen or argon, and adding dropwise the base which preferably is an organic amine such as dicyclohexylamine. As will be recognized by those skilled in the synthesis art, for preparation of photoactive compounds of formula II, the sulfonyl compound used in the condensation reaction will comprise a single R group and multiple sulfonyl groups. For example, (disulfonylchloride)benzene could be used.

After the base addition of the reaction depicted in the Scheme is complete, the reaction solution is suitably stirred from 0° C. to room temperature until reaction completion, i.e. completion of condensation of compounds 1 and 2. The resultant photoactive compound 3 can be isolated and, if desired, purified by known techniques such as filtration followed by recrystallization and/or chromatography.

In the reaction depicted in the Scheme, the base and compound 2 are preferably used in molar equivalent amounts. For preparation of those preferred photoactive compounds of the invention having a single benzylsulfonyl substitution, specifically compounds of formula I where n is 1, sulfonyl compound 2 is suitably reacted with benzyl alcohol 1 in a slight molar excess. For photoactive compounds of formula I where n is greater than 1, a molar excess of compound 2 is employed, typically where the molar ratio of compound 2 and the benzyl alcohol group(s) of compound 1 approximately equal the desired substitution of the photoactive reaction product, i.e. where the molar ratio of reagent 2 to the benzyl alcohol groups(s) of reagent 1 equals the desired value of n. Similarly, for preparation of compounds of formula II, the benzyl alcohol and sulfonyl compound are reacted where the molar amount of reactive sulfonyl groups is approximately equal to the molar amount of benzyl alcohol groups of 1.

As used herein in reference to substituents groups of photoactive compounds of formula I and II (i.e., groups R, $R^1$, $R^2$, $R^3$, $R^4$, $R^5$, $R^6$, $R^7$ and $R^6$) the term alkyl unless otherwise modified refers to both noncyclic and cyclic groups. Noncyclic alkyl groups are generally more preferred than cyclic alkyl substituent groups. Alkyl substituent groups preferably have from 1 to about 16 carbon atoms, more preferably have from 1 to about 10 carbon atoms, still more preferably have from I to about 8 carbon atoms, although of course cyclic alkyl groups will contain at least 3 carbon atoms. In the case of $R^1$, $R^2$ or the phenyl ring substituents being alkoxy, preferred alkoxy groups include those having one or more oxygen linkages and from I to about 16 carbon atoms, more preferably from 1 to about 8 carbon atoms. Alkenyl and alkynyl substituent groups of compounds of formulas I and II preferably have from 2 to about 16 carbon atoms, more preferably from 2 to about 8 carbon atoms. Preferred aryl substituent groups have 6 to about 16 aromatic carbon atoms, more preferably 6 or 10 aromatic carbon atoms. Preferred aralkyl substituent groups have 6 to about 16 aromatic carbon atoms, more preferably 6 or 10 aromatic carbon atoms, and further preferably contain from 1 to about 16 additional (non-aromatic) carbon atoms, more preferably from I to about 8 additional carbon atoms. Suitable halo substituent groups are F, CI, Br and I. Fluoro is particularly preferred. In those compounds of formulas I and II where phenyl ring substituents $R^3$ and $R^4$-$R^8$ is alkanoyl, preferably the alkanoyl group comprises 1 to about 16 carbon atoms, more preferably 1 to about 8 carbon atoms, still more preferably 1 to about 4 carbon atoms. Acyl is a particularly suitable alkanoyl group. Carboxyl ring substituents of compounds of formula I and II include acid groups of the formula —$(CH_2)_n$COOH (where n is an integer equal to 0 or greater, preferably 0 to about 8) as well as ester groups of the formula —$(CH_2)_n$COOY (where n is as defined above for acid groups and Y is substituted or unsubstituted alkyl group, preferably having from I to about 12 carbon atoms, more preferably having from 1 to about 8 carbon atoms). Preferred sulfonyl substituent groups have the formula —SO$_2$R″ where R″ is substituted or unsubstituted alkyl (said alkyl preferably having from 1 to about 16 carbon atoms, more preferably 1 to about 8 carbon atoms) or substituted or unsubstituted aryl (preferably having from 6 to about 16 aromatic carbon atoms, more preferably 6 or 10 aromatic carbon atoms).

Said substituted substituent groups of compounds of formula I and II are suitably groups substituted at one or more available positions by, e.g., halogen such as F, Cl, Br and/or I, alkyl including $C_{1-16}$ alkyl with $C_{1-8}$ alkyl being preferred, alkoxy including $C_{1-16}$ alkoxy having one or more oxygen linkages with $C_{1-8}$ alkoxy being preferred, alkenyl including $C_{2-12}$ alkenyl with $C_{2-8}$ alkenyl being preferred, alkynyl including $C_{2-12}$ alkynyl with $C_{2-8}$ alkynyl being preferred, aryl such as phenyl or naphthyl and substituted aryl such as halo, alkoxy, alkenyl, alkynyl and/or alkyl substituted aryl, preferably having the number of carbon atoms mentioned above for corresponding groups. Preferred substituted aryl groups include substituted phenyl and naphthyl. The substituted substituent groups of compounds of formulas I and II also may be suitably substituted at one or more available positions by heteroatom containing groups, including groups containing one or more N, 0 and/or S atoms. Preferred groups include alkyl, alkenyl and alkynyl heterosubstituted groups, and hydroxyl, amino, thio including alkylthio preferably having I to about 8 carbon atoms and one or more thio linkages, cyano, sulfone and sulfide groups.

The moiety R of compounds of formula I and II preferably is an electron donating group, although electron-withdrawing groups also will be suitable. Also preferred is where R is an aryl group, particularly a substituted phenyl or naphthyl group. More preferred is where R is such a substituted aryl group and contains one or more electron donating ring substituent groups such as $C_{1-12}$ alkyl or $C_{1-12}$ alkoxy. Especially preferred photoactive compounds of this invention include those where one or both of $R^1$ and $R^2$ are hydrogen. Preferred photoactive compounds of the invention also include those where one or both of $R^1$ and $R^2$ are substituted or unsubstituted phenyl including phenyl substituted with one or more electron withdrawing groups such as halo, particularly fluoro.

Preferred photoactive compounds of the invention also include those having electron-withdrawing phenyl ring substituents, i.e. where one or more of the phenyl ring substituents $R^3$ or $R^4$—$R^8$ is an electron-withdrawing group such as halo, sulfonyl, cyano or acyl, especially halo, particularly fluoro. Particularly preferred photoactive compounds are those having para substitution with an electron withdrawing group $R^3$ or $R^6$, especially .para substitution with a halo group. Compounds having p-fluoro substitution are particularly suitable, including compounds where each $R^3$ or each $R^4$—$R^8$ substituent is fluoro. Specifically preferred compounds include those where $R^3$ or $R^4$—$R^8$ is an electron-withdrawing group, especially halo, particularly fluoro, and $R^1$ and/or $R^2$ is phenyl substituted by one or more electron withdrawing groups, especially halo, particularly fluoro. Also specifically preferred are compounds where each of $R^4$—$R^8$ is fluoro, $R^1$ is pentafluorophenyl and $R^2$ is hydrogen.

As discussed above, the photoactive compounds of formulas I and II are useful as a photoactive component in photoresist composition, including both positive-acting and negative-acting chemically amplified resist compositions.

The photoresists of the invention typically comprise a resin binder and a photoactive component, the photoactive component comprising one or more compounds of formula I and/or II. Preferably the resin binder has functional groups that impart alkaline aqueous developability to the resin composition. For example, preferred are resin binders that comprise polar functional groups such as hydroxyl or carboxylate. Preferably the resin binder is used in a resist composition in an amount sufficient to render the resist developable with an aqueous alkaline solution. Particularly preferred resin binders are phenolic resins including phenol aldehyde condensates known in the art as novolak resins, homo and copolymers of alkenyl phenols and homo and copolymers of N-hydroxyphenyl-maleimides.

Examples of suitable phenols for condensation with an aidehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5, 128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Particularly preferred materials for use as a resin binder components in the resist compositions of the invention are copolymers containing phenol and nonaromatic cyclic alcohol units which may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binders include resins formed from bishydroxymethylated compounds, and block novolak resins. See U.S. Pat. Nos. 5, 130,410 and 5, 128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

A preferred class of photoresists of this invention are "conventional" positive-acting resists that comprise one or more photoactive compounds of formula I and/or formula II and a resin binder component such as a novolak or poly(vinylphenol) or partially hydrogenated derivative thereof and wherein the photoactive compound serves as a dissolution rate inhibitor. Photoactivation of a coating layer of the resist results in conversion of the photoactive compound(s) of formula I and/or II to an acidic material, rendering regions of the coating layer containing this acidic photoproduct comparatively more soluble in an aqueous alkaline developer solution than regions that contain only the intact photoactive compound.

In particularly preferred aspects of the invention, one or more photoactive compounds of formula I and/or formula II are used as the photoactive components in a chemically amplified positive-acting resist. A number of such resist compositions have been described, e.g., in U.S. Pat. Nos. 4,968,581; 4,883,740; 4,810,613 and 4,491,628 and Canadian Patent Application 2,001,384, all of which are incorporated herein by reference for their teaching of making and using chemically amplified positive-acting resists.

A particularly preferred chemically amplified photoresist of the invention comprises in admixture one or more compounds of formula I and/or formula II and a resin binder that comprises a copolymer containing both phenolic and nonaromatic cyclic alcohol units and wherein at least of portion of the hydroxyl groups of the copolymer are bonded to acid labile groups. Preferred acid labile moieties are t-butyl acetate groups of the formula $(CH_3)_3OC(O)CH_2—$. Chemically amplified positive-acting photoresists containing such a copolymer have been disclosed in copending and commonly assigned U.S. patent application Ser. No. 07/763,827 of Sinta et al., filed on Sep. 23, 1991, and in European Patent Application No. 92115982.8, published on Mar. 31, 1993.

Preferred negative-acting compositions of the invention comprise a mixture of materials that will cure, crosslink or harden upon exposure to acid, and a radiation sensitive component wherein the radiation sensitive component comprises one or more photoactive compounds of formula I and/or formula II.

Particularly preferred negative acting compositions comprise a resin binder such as a phenolic resin, a crosslinker component and one or more photoactive compounds of formula I and/or formula II. Such compositions and the use thereof has been disclosed in European Patent Applications 0164248 and 0232972 and in U.S. Pat. No. 5, 128,232 to Thackeray et al. Preferred phenolic resins for use as the resin binder component include novolaks and poly(vinylphenol)s such as those discussed above. Preferred crosslinkers include amine-based materials, including melamines, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

An especially preferred negative-acting photoresist composition comprises a resin binder that comprises a copolymer containing phenolic units and nonaromatic cyclic alcohol units, a crosslinking agent and one or more compounds of formula I and/or formula II. The nonaromatic cyclic alcohol-phenol copolymer of the resin binder component and use of the same in negative-acting compositions has been disclosed in U.S. Pat. No. 5, 128,232 to Thackeray, et al. Preferred crosslinking agents include amine-based materials such as those mentioned above, particularly the melamines such as melamine-formaldehyde resins.

Photoresists of the invention also may contain other materials. For example, other optional additives include actinic and contrast dyes, anti-striation agents, plasticizers, speed enhancers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred additive of resist compositions of the invention is one or more sensitizer compounds that expand or enhance the resist's spectral response to activating radiation. Preferred photosensitizer compounds include aromatic compounds such as phenyl-based compounds, e.g. a substituted or unsubstituted benzene or a phenyl oligomer or polymer such as novolak or poly(vinylphenol) oligomer or polymer, naphthyl-based compounds as well as other fused ring compounds. More preferred are aromatic compounds that contain electron donating ring substituents such as hydroxy, alkoxy including alkoxy groups having from I to about 12 carbon atoms, preferably 1 to about 6 carbon atoms, alkyl including alkyl groups having from 1 to about 12 carbon atoms, preferably I to about 6 carbon atoms, and thio groups including alkylthio groups having one or more thio linkages and 1 to about 12 carbon atoms, preferably I to about 6 carbon atoms. Particularly preferred sensitizer compounds include phenyl or naphthyl substituted by one or more alkyl, hydroxy and/or alkoxy, particularly polyalkoxy phenyl and naphthyl, e.g. phenyl or naphthyl having from 2 to 6 alkoxy substituents, each alkoxy substituent having one or more oxygen linkages and from I to about 12 carbon atoms, more preferably 1 to about 6 carbon atoms. Specifically preferred sensitizer compounds include polyalkoxyphenyl compounds such as those compounds with alkoxy groups having from I to about 6 carbon atoms such as 1,2,3-trimethoxybenzene; polyhydroxyphenylalkyl compounds such as those compounds having a phenyl substituted alkyl group of 1 to about 6 carbon atoms such as trihydroxyphenyl ethane, particularly tris(4-hydroxyphenyl)ethane; bisphenol-A compounds; benzyl benzenetriol compounds such as a compound of the formula $C_6H_5CH_2C_6H_2OH)_3$; trihydroxybenzophenone; resorcinols; and pyrogallol. Such sensitizer compounds are suitably used in a resist composition of the invention in amounts of from 1 to about 30 percent by weight of the total weight of a resist's dry components, more preferably in amounts of from 5 to about 20 weight percent.

The photoresists of the invention are generally prepared following known procedures with the exception that one or more compounds of formula I and/or formula II are substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; a Cellosolve ester such as methyl Cellosolve acetate; an aromatic hydrocarbon such toluene or xylene; or a ketone such as methylethyl ketone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image. The substrate suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Substrates used for liquid crystal display and other flat panel display applications are also suitably employed, e.g. glass substrates, indium tin oxide coated substrates and the like. A liquid coating resist composition may be applied by any standard means such as spinning, dipping or roller coating. The exposure energy should be sufficient to effectively activate the photoactive component of the radiation sensitive system to produce a patterned image in the resist coating layer. Suitable exposure energies typically range from about 10 to 300 mJ/cm$^2$. An exposure wavelength in the deep U.V. range often preferably will be used for the photoresists of the invention, particularly an exposure wavelength of about 248 nm. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

The following non-limiting examples are illustrative of the invention.

EXAMPLES 1–6 Synthesis of Photoactive Compounds

EXAMPLE 1

Synthesis of Pentafluorobenzyl-4-methylbenzene sulfonate.

To a solution of pentafluorobenzyl alcohol (35.0 g, 0.177 mol) and p-toluenesulfonyl chloride (37.05 g, 0.194 mol) in dry acetone (150 ml), a solution of dicyclohexylamine (35.16 g, 0.194 mol) in acetone (50 ml) was added dropwise at 0-5° C. under nitrogen. After addition of the dicyclohexylamine the reaction temperature was increased to 25° C. and stirring continued for 2 hours under nitrogen. The reaction was then filtered and the filtrate evaporated under reduced pressure. The crude white solid was recrystallized from methanol to give 45.62 g (73% of theory) of the title compound having a melting point of 79° C.

$^1$H NMR ∂ppm (acetone-d$_6$): 2.45 (3H, s, CH$_3$); 5.25 (2H, t, CH$_2$); 7.48 (2H, d, aromatic); 7.80 (2H, d, aromatic)

IR (KBr disk, cm$^{-1}$): 1366 and 1176 (SO$_2$)

EXAMPLE 2

Synthesis of Pentafluorobenzyl-4-fluorobenzene sulfonate

Using 4-fluorobenzenesulfonyl chloride in place of p-toluenesulfonyl chloride, the reaction was carried out using the experimental procedure described in Example 1 above. The crude product was recrystallized from methanol/water to provide the title compound, yield 43% of theory, melting point 67° C.

$^1$H NMR ∂ppm (acetone-d$_6$): 5.31 (2H, t, CH$_2$); 7.47 (2H, t, aromatic); 8.30 (2H, dd, aromatic)

IR (KBr disk, cm$^{-1}$): 1349 and 1189 (SO$_2$)

EXAMPLE 3

Synthesis of Pentafluorobenzyl-4, 5-dimethoxybenzene sulfonate

Using 4,5-dimethoxybenzenesulfonyl chloride in place of p-toluene sulfonyl chloride, the reaction was carried out using the experimental procedure described in Example 1 above. The crude product was recrystallized from methanol to provide the title compound, yield 70% of theory, melting point 91° C.

$^1$H NMR ∂ppm (acetone-d$_6$): 3.89 (3H, s, OCH$_3$); 3.92 (3H, s, OCH$_3$); 5.23 (2H, t, CH$_2$); 7.18 (1H, d, aromatic); 8.52 (2H, dd, aromatic)

IR (KBr disk, cm$^{-1}$): 1368 and 1170 (SO$_2$)

EXAMPLE 4

Synthesis of Pentafluorobenzyl-2,4,6-trimethylbenzene sulfonate

Using 2,4,6-trimethylbenzenesulfonyl chloride in place of p-toluenesulfonyl chloride, the reaction was carried out using the experimental procedure described in Example 1 above. The crude product was recrystallized from methanol/acetone to provide the title compound, yield 77% of theory, melting point 137° C.

$^1$H NMR ∂ppm (acetone-d$_6$): 2.30 (3H, s, CH$_3$); 2.56 (6H, s, CH$_3$); 5.24 (2H, t, CH$_2$); 7.07 (2H, s, aromatic)

IR (KBr disk, cm$^{-1}$): 1358 and 1176 (SO$_2$)

EXAMPLE 5

Synthesis of Pentafluorobenzyl-2,3,6-trimethyl-4-methoxybenzene sulfonate

Using 2,3,6-trimethyl-4-methoxybenzenesulfonyl chloride in place of potoluenesulfonyl chloride, the reaction was carried out using the experimental procedure described in Example 1 above. The crude product was recrystallized from methanol/acetone to provide the title compound, yield 78% of theory, melting point 109° C.

$^1$H NMR ∂ppm (acetone-d$_6$): 2.07 (3H, s, CH$_3$); 2.45 (3H, s, CH$_3$); 2.60 (3H, s, CH$_3$); 3.90 (3H, s, OCH$_3$); 5.22 (2H, t, CH$_2$); 6.83 (1H, s, aromatic)

IR (KBr disk, cm$^{-1}$): 1346 and 1187 (SO$_2$)

EXAMPLE 6

Synthesis of Pentafluorobenzyl-ethane sulfonate

Using ethane sulfonyl chloride in place of p-toluenesulfonyl chloride, the reaction was carried out using the experimental procedure described in Example 1 above. The crude liquid product was distilled under reduced pressure (boiling point 104–110° C./0.6 mmHg), to provide the title compound (77% of theory).

$^1$H NMR ∂ppm (acetone-d$_6$): 1.34 (3H, t, CH$_3$); 3.34 (2H, q, CH$_2$); 5.41 (2H, t, CH$_2$)

IR (KBr disk, cm$^{-1}$): 1360 and 1172 (SO$_2$)

EXAMPLES 7–11 Preparation of Photoresist Compositions and Formation of Relief Images

EXAMPLE 7

Positive tone resist material containing pentafluorobenzyl-4-methylbenzene sulfonate.

A resist material was prepared consisting of in admixture 15% t-butylacetate blocked poly(p-vinylphenol)(5.00 g), pentafluorobenzyl-4-methylbenzene sulfonate (1.00 g), a leveling agent (0.25 g) and propyleneglycol monomethylether acetate (20.41 g). The poly(p-vinyl)phenol was obtained PHM-C Grade obtained from Maruzen Oil of Tokyo Japan. 15% of the total number of hydroxyl groups of the polymer were bonded to t-butylacetate groups, i.e. groups of the formula (CH$_3$)$_3$COC(O)CH$_2$-. The resist formulation was then filtered through 0.2 µm polytetrafluoroethylene (PFTE) filters. The resist material was then spin coated onto hexamethyldimethylsilane treated 4" silicon wafers at 3000 rpm for 30 seconds. After soft baking at 90° C. for 60 seconds on a vacuum hot plate a 0.9 µm thick resist film was obtained. The resist film was then exposed to broadband light through an Optiline ® mask using an HTG ® exposure tool. After exposure the resist film was baked at 70° C. for 240 seconds, followed by immersion development in a 0.17 N aqueous tetramethylammonium hydroxide solution for 60 seconds. A good quality positive tone image was obtained using an exposure energy of 52 mJ/cm$^2$.

EXAMPLE 8

Positive tone resist material containing pentafluorobenzyl-4-methylbenzene sulfonate and 1,2,3-trimethoxybenzene as sensitizer.

A resist formulation was prepared as described in Example 7 above with the incorporation of 10% (based on polymer weight) of 1,2,3-trimethoxybenzene as sensitizer. The resist material was processed as described in Example 7. A good quality positive tone image was obtained using an exposure energy of 45 mJ/cm$^2$.

EXAMPLE 9

Positive tone resist material containing pentafluorobenzyl-4-methylbenzene sulfonate and tris(4-hydroxyphenyl)ethane as sensitizer.

A resist formulation was prepared as described in Example 7 above with the incorporation of 10% (based on polymer weight) of tris(4-hydroxyphenyl)ethane as sensitizer. The resist material was processed as described in Example 7. A good quality positive tone image was obtained using an exposure energy of 19 mJ/cm$^2$.

EXAMPLE 10

Positive tone resist material containing pentafluorobenzyl-4-fluorobenzene sulfonate and 1,2,3-trimethoxybenzene as sensitizer.

A resist formulation was prepared using pentafluorobenzyl-4-fluorobenzene sulfonate in place of pentafluorobenzyl-4-methylbenzene sulfonate as described in Example 7 with the incorporation of 10% (based on polymer weight) of 1,2,3-trimethoxybenzene as sensitizer. The resist material was processed as described in Example 7. A good quality positive tone image was obtained using an exposure energy of 35 mJ/cm$^2$.

EXAMPLE 11

Positive tone resist material containing pentafluorobenzyl-2,4,6-trimethylbenzene sulfonate and 1,2,3-trimethoxybenzene as sensitizer.

A resist formulation was prepared using pentafluorobenzyl-2,4,6-trimethylbenzene sulfonate in place of pentafluorobenzyl-4-methylbenzene sulfonate as described in Example 7 with the incorporation of 10% (based on polymer weight) of 1,2,3-trimethoxybenzene as sensitizer. The resist material was processed as described in Example 7. A positive tone image was obtained using an exposure energy of 97 mJ/cm$^2$.

The foregoing description of the present invention is merely illustrative thereof, and it is understood that variations and modifications can be made without departing from the spirit or scope of the invention as set forth in the following claims.

What is claimed:

1. A photoresist comprising a resin binder and at least one photoactive compound of the following formula:

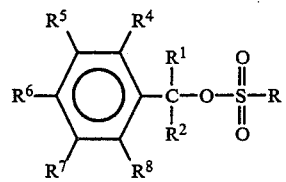

wherein R is selected from the group consisting of substituted and unsubstituted alkyl, substituted and unsubstituted alkoxy, substituted and unsubstituted aralkyl, and substituted and unsubstituted aryl;

R$^1$ and R$^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, substituted and unsubstituted aralkyl and substituted and unsubstituted aryl;

each R$^4$, R$^5$, R$^6$, R$^7$ and R$^8$ is independently selected from the group consisting of hydrogen, halo, hydroxy, cyano, alkanoyl, carboxyl, sulfonyl, substituted and unsubstituted alkyl, substituted and unsubstituted alkenyl, substituted and unsubstituted alkynyl, substituted and unsubstituted aralkyl and substituted and unsubstituted aryl, wherein at least one of R$^4$, R$^5$, R$^6$, R$^7$ and R$^8$ is other than hydrogen.

2. The photoresist of claim 1 wherein the composition is a positive-acting photoresist.

3. The photoresist composition of claim 1 where the composition is a chemically amplified positive-acting composition.

4. The photoresist composition of claim 3 where the resin binder comprises a polymer having acid labile groups.

5. The photoresist composition of claim 4 where the polymer has pendant acid labile groups and contains phenolic and nonaromatic cyclic alcohol units.

6. The photoresist composition of claim 1 where the composition is a negative-acting composition.

7. The photoresist composition of claim 1 where the composition is a negative acting acid-hardening composition comprising an amine-based crosslinker and a phenolic resin.

8. The photoresist composition of claim 1 where at least one of $R^1$ and $R^2$ is hydrogen.

9. The photoresist composition of claim 1 where one or more of the groups $R^4$, $R^5$, $R^6$, $R^7$, and $R^8$ is an electron-withdrawing group.

10. The photoresist composition of claim 1 where one or more of the groups $R^4$, $R^5$, $R^6$, $R^7$, and $R^8$ is fluoro.

11. The photoresist composition of claim 1 where the photoactive compound is selected from the group consisting of pentaflurobenzyl-4-methylbenzene sulfonate, pentaflurobenzyl-4-fluorobenzene sulfonate, pentafluorobenzyl-4,5-dimethozybenzene sulfonate, pentafluorobenzyl-2,4,6-trimethylbenzene sulfonate, pentafluorobenzyl-2,3,6-trimethyl-4-methoxybenzene sulfonate and pentafluorobenzyl-ethane sulfonate.

12. The photoresist composition of claim 1 further comprising a sensitizer compound.

13. The photoresist composition of claim 12 where the sensitizer compound is a phenyl-based compound.

14. The photoresist compositions of claim 13 where the phenyl-based compound is substituted with one or more electron-donating groups.

15. An article of manufacture comprising a substrate having on at least one surface a coating layer of the photoresist of claim 1.

16. The photoresist composition of claim 1 where the substituents $R^4$, $R^5$, $R^6$, $R^7$ and $R^8$ are each hydrogen or an electron-withdrawing group, and at least one of $R^4$, $R^5$, $R^6$, $R^7$ and $R^8$ is an electron-withdrawing group.

17. The photoresist composition of claim 16 where the one or more electron-withdrawing $R^4$, $R^5$, $R^6$, $R^7$ or $R^8$ groups are halo.

18. The photoresist composition of claim 16 where the one or more electron-withdrawing $R^4$, $R^5$, $R^6$, $R^7$ or $R^8$ groups are fluoro.

19. The photoresist composition of claim 16 where the photoresist is a chemically-amplified resist.

20. A photoresist composition comprising a resin binder and one or more photoactive compounds of of the following formula I:

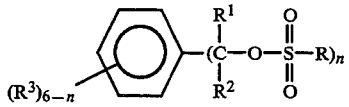

wherein R is selected from the group consisting of substituted and unsubstituted alkyl, substituted and unsubstituted alkoxy, substituted and unsubstituted aralkyl, and substituted and unsubstituted aryl;

$R^1$ and $R^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, substituted and unsubstituted aralkyl, and substituted and unsubstituted aryl;

each $R^3$ phenol ring substituent is independently selected from the group consisting of hydrogen, halo, hydroxy, cyano, alkanoyl, carboxyl, sulfonyl, substituted and unsubstituted alkyl, substituted and unsubstituted alkenyl, substituted and unsubstituted aryl, and substituted and unsubstituted aralkyl; and n is an integer of from 1 to 6.

21. The photoresist composition of claim 20 further comprising one or more photoactive compounds of the following formula II:

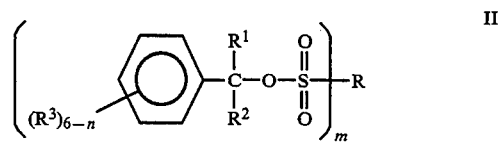

wherein R is selected from the group consisting of substituted and unsubstituted alkyl, substituted and unsubstituted alkoxy, substituted and unsubstituted aralkyl, and substituted and unsubstituted aryl;

$R^1$ and $R^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, substituted and unsubstituted aralkyl and substituted and unsubstituted aryl;

each $R^3$ phenyl ring substituent is independently selected from the group consisting of hydrogen, halo, hydroxy, cyano, alkanoyl, carboxyl, sulfonyl, substituted and unsubstituted alkyl, substituted and unsubstituted alkenyl, substituted and unsubstituted aryl, and substituted and unsubstituted aralkyl; n is an integer of from 1 to 5; and m is an integer of from 2 to 6.

22. A photoresist composition comprising a resin binder and one or more photoactive compounds of of the following formula II:

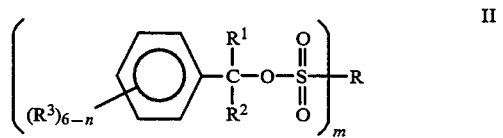

wherein R is selected from the group consisting of substituted and unsubstituted alkyl, substituted and unsubstituted alkoxy, substituted and unsubstituted aralkyl, and substituted and unsubstituted aryl;

$R^1$ and $R^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, substituted and unsubstituted aralkyl and substituted and unsubstituted aryl;

each $R^3$ phenyl ring substituent is independently selected from the group consisting of hydrogen, halo hydroxy, cyano, alkanoyl, carboxyl, sulfonyl, substituted and unsubstituted alkyl, substituted and unsubstituted alkenyl, substituted and unsubstituted aryl, and substituted and unsubstituted aralkyl; n is an integer of from 1 to 5; and m is an integer of from 2 to 6.

23. A photoresist comprising a resin binder and at least one photoactive compound of the following formula:

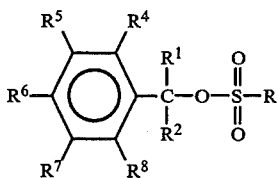

wherein R is selected from the group consisting of substituted and unsubstituted alkyl, substituted and unsubstituted alkoxy, substituted and unsubstituted aralkyl, and substituted and unsubstituted aryl;

$R^1$ and $R^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, and substituted and unsubstituted aryl;

each $R^4$, $R^5$, $R^6$, $R^7$ and $R^8$ is independently selected from the group consisting of hydrogen, an electron-withdrawing group, substituted and unsubstituted alkyl, substituted and unsubstituted alkenyl, substituted and unsubstituted alkynyl, substituted and unsubstituted aralkyl and substituted and unsubstituted aryl.

24. The photoresist composition of claim 23 where $R^1$ and $R^2$ are each independently selected from the group consisting of hydrogen and substituted and unsubstituted aryl.

25. The photoresist composition of claim 23 where one or more of the groups $R^4$, $R^5$, $R^6$, $R^7$ and $R^8$ is an electron withdrawing group.

26. The photoresist of claim 25 where said one or more electron-withdrawing groups is halo, sulfonyl, cyano or acyl.

27. A photoresist comprising a resin binder and at least one photoactive compound of the following formula:

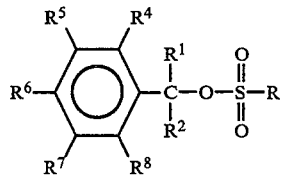

wherein R is selected from the group consisting of substituted and unsubstituted alkyl, substituted and unsubstituted alkoxy, substituted and unsubstituted aralkyl, and substituted and unsubstituted aryl;

$R^1$ and $R^2$ are each independently selected from the group consisting of hydrogen, halo, cyano, substituted and unsubstituted alkyl, substituted and unsubstituted alkoxy, substituted and unsubstituted alkenyl, substituted and unsubstituted alkynyl, substituted and unsubstituted aralkyl and substituted and unsubstituted aryl;

each $R^4$, $R^5$, $R^6$, $R^7$ and $R^8$ is independently selected from the group consisting of hydrogen, an electron-withdrawing group, substituted and unsubstituted alkyl, substituted and unsubstituted alkenyl, substituted and unsubstituted alkynyl, substituted and unsubstituted aralkyl and substituted and unsubstituted aryl, wherein at least one of $R^4$, $R^5$, $R^6$, $R^7$ and $R^8$ is other than hydrogen.

28. The photoresist composition of claim 27 where one or more of the groups $R^4$, $R^5$, $R^6$, $R^7$ and $R^8$ is an electron withdrawing group selected from the group consisting of halo, sulfonyl, cyano or acyl.

* * * * *